(12) United States Patent
Cappelletti et al.

(10) Patent No.: US 11,355,702 B2
(45) Date of Patent: Jun. 7, 2022

(54) MEMORY DEVICE

(71) Applicants: STMicroelectronics S.r.l., Agrate Brianza (IT); Commissariat A L'Energie Atomique et aux Energies Alternatives, Paris (FR)

(72) Inventors: Paolo Giuseppe Cappelletti, Seveso (IT); Gabriele Navarro, Moirans (IT)

(73) Assignees: STMicroelectronics S.r.l., Agrate Brianza (IT); Commissariat A L'Energie Atomique et aux Energies Alternatives, Paris (FR)

( * ) Notice: Subject to any disclaimer, the term of this patent is extended or adjusted under 35 U.S.C. 154(b) by 181 days.

(21) Appl. No.: 16/533,255

(22) Filed: Aug. 6, 2019

(65) Prior Publication Data

US 2020/0052199 A1     Feb. 13, 2020

(30) Foreign Application Priority Data

Aug. 8, 2018  (FR) ...................................... 1857389

(51) Int. Cl.
*H01L 45/00* (2006.01)
*H01L 27/24* (2006.01)

(52) U.S. Cl.
CPC .......... *H01L 45/06* (2013.01); *H01L 27/2463* (2013.01); *H01L 45/126* (2013.01); *H01L 45/1233* (2013.01); *H01L 45/144* (2013.01); *H01L 45/1608* (2013.01); *H01L 45/1641* (2013.01)

(58) Field of Classification Search
CPC ......... H01L 45/00–1691; H01L 27/2463–249; H01L 27/2427
See application file for complete search history.

(56) References Cited

U.S. PATENT DOCUMENTS

| | | | |
|---|---|---|---|
| 8,803,119 B2 | 8/2014 | Morikawa et al. | |
| 9,177,640 B2 | 11/2015 | Shintani et al. | |
| 10,541,271 B2 | 1/2020 | Cheng et al. | |
| 2002/0131309 A1 | 9/2002 | Nishihara et al. | |
| 2006/0001000 A1* | 1/2006 | Pinnow ................. | H01L 45/085 252/62.2 |
| 2008/0068879 A1 | 3/2008 | Ahn et al. | |
| 2010/0072453 A1 | 3/2010 | Jeong et al. | |
| 2013/0181183 A1 | 7/2013 | Pellizzer et al. | |
| 2016/0072059 A1 | 3/2016 | Kim et al. | |

(Continued)

FOREIGN PATENT DOCUMENTS

| | | |
|---|---|---|
| CN | 105870323 A | 8/2016 |
| KR | 20100063613 A | 6/2010 |

OTHER PUBLICATIONS

INPI Search Report and Written Opinion for FR 1857389 dated May 9, 2019 (7 pages).

*Primary Examiner* — Eric A. Ward
(74) *Attorney, Agent, or Firm* — Crowe & Dunlevy

(57) ABSTRACT

A phase-change memory cell includes, in at least a first portion, a stack of at least one germanium layer covered by at least one layer made of a first alloy of germanium, antimony, and tellurium In a programmed state, resulting from heating a portion of the stack to a sufficient temperature, portions of layers of germanium and of the first alloy form a second alloy made up of germanium, antimony, and tellurium, where the second alloy has a higher germanium concentration than the first alloy.

45 Claims, 5 Drawing Sheets

(56) References Cited

U.S. PATENT DOCUMENTS

2019/0334083 A1* 10/2019 Wu .................. H01L 45/144
2020/0052197 A1    2/2020 Navarro et al.
2020/0052199 A1    2/2020 Cappelletti et al.

* cited by examiner

MEMORY DEVICE

PRIORITY CLAIM

This application claims the priority benefit of French Application for Patent No. 1857389, filed on Aug. 8, 2018, the content of which is hereby incorporated by reference in its entirety to the maximum extent allowable by law.

TECHNICAL FIELD

The present disclosure generally relates to memory devices, and more particularly to memories comprising a phase-change alloy made up of germanium, antimony, and tellurium.

BACKGROUND

Phase-change materials are materials which can switch, under the effect of heat, between a crystalline phase and an amorphous phase. Since the electric resistance of an amorphous material is significantly greater than the electric resistance of a crystalline material, such a phenomenon may be useful to define two memory states, for example, 0 and 1, differentiated by the resistance measured through the phase-change material. The most common phase-change materials in memories are alloys made up of germanium, antimony, and tellurium.

The usual phase-change memories are generally made of an alloy of germanium, of antimony and of tellurium in stoichiometric proportions, for example $Ge_2Sb_2Te_5$. A problem is that such alloys are sensitive to temperature. Specifically, their crystallization temperature is too low to withstand the temperature range of the die soldering process, especially in the automotive industry. The welding temperature would cause the modification of the programmed data.

SUMMARY

An embodiment overcomes all or part of the disadvantages of known phase-change memories.

In an embodiment, a memory device comprises: a first phase-change memory cell; a second phase-change memory cell; wherein the first phase-change memory cell comprises a first alloy made up of germanium, antimony, and tellurium; and wherein the second phase-change memory cell comprises the first alloy and a second alloy made up of germanium, antimony, and tellurium

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the memory cells comprise elements which are not detailed, for example, selection elements, for example, transistors, or electric connections.

Throughout the present disclosure, the term "connected" is used to designate a direct electrical connection between circuit elements, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise mentioned, it is referred to the orientation of the drawings.

The terms "approximately", "substantially", and "in the order of" are used herein to designate a tolerance of plus or minus 10%, preferably of plus or minus 5%, of the value in question. The terms "close to" are used herein to designate a tolerance of plus or minus 35%.

Figure 1:
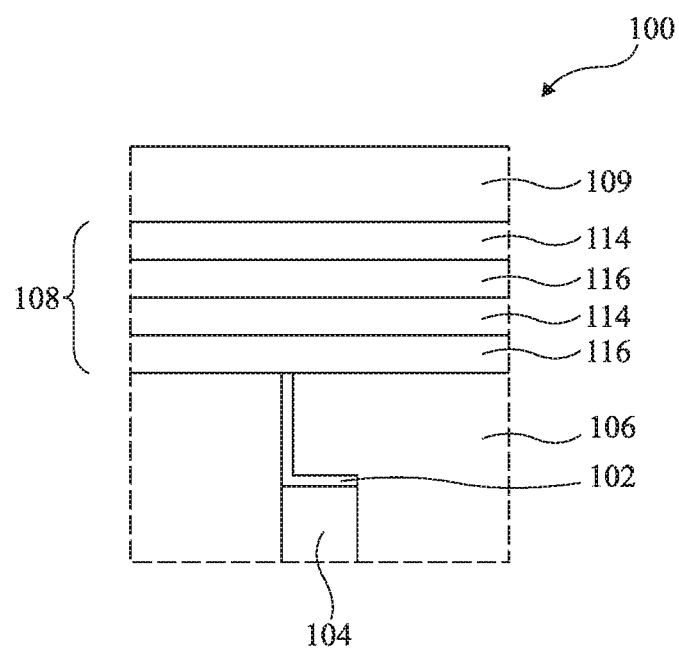
FIG. 1 shows a simplified cross-section view of an embodiment of a portion of a phase-change memory cell.

FIG. 1 shows a simplified cross-section view of a portion of an embodiment of a phase-change memory cell 100.

Memory cell 100 comprises a resistive element 102 connected to a selection element, for example, a transistor, not shown, via a conductive via 104. Resistive element 102, for example, has an L-shaped cross-section having its horizontal portion in contact with conductive via 104. Resistive element 102 and conductive via 104 are surrounded with an insulating layer 106. The thickness of layer 106 is such that the upper surface of the vertical portion of the resistive element is coplanar with the upper surface of insulating layer 106. The selection element is located under layer 106.

Memory cell 100 further comprises a stack 108 of layers resting on the upper surface of insulating layer 106 and on the upper surface of the vertical portion of resistive element 102. A conductive layer 109 rests on stack 108. Conductive layer 109 forms an electrode of the memory cell.

Stack 108 comprises layers 114 made of germanium or nitrogen doped germanium and layers 116 made of a first alloy of germanium, of antimony, and of tellurium. The layers of stack 108 are alternately layers 114 and layers 116.

In the embodiment of FIG. 1, stack 108 comprises two germanium layers 114 and two layers 116 of the first alloy. The lower layer of stack 108 is, in this example, one of layers 116 and is located on the side of layer 106.

The first alloy is a stable alloy, that is, the proportions of the various components are close to stoichiometric. The first alloy is for example $Ge_2Sb_2Te_5$, $Ge_4Sb_4Te_7$ or an alloy made up of germanium, antimony and tellurium with atomic percentages close to the atomic percentages of $Ge_2Sb_2Te_5$ or $Ge_4Sb_4Te_7$. The first alloy of layers 116 are preferably in a crystalline phase. Layers 114 are for example made of non-doped germanium or of germanium doped with nitrogen atoms. In the case of layers 114 in germanium doped with nitrogen atoms, the nitrogen content is preferably lower than 35% of the atomic count. The material of layers 114 is for example in an amorphous phase.

The layers of stack 108, for example, have a thickness greater than approximately 4 nm, for example, in the range from 4 to 30 nm. Layers 114 and layers 116 may be of different thickness.

In some embodiment, the different layers 116 are made of different alloys of germanium, of antimony and of tellurium chosen among the example given previously for the first alloy. For example, the stack 108 may comprise a layer 114 of germanium situated between a layer 116 made of $Ge_2Sb_2Te_5$ and a layer 116 made of $Ge_4Sb_4Te_7$. Those different alloys will nonetheless be referred to as the first alloy in the following description.

More generally, stack 108 comprises at least one germanium layer 114 and a layer 116 made of the first alloy, layer 116 covering layer 114. Preferably, stack 108 comprises a layer 114 located between two layers 116 made of the first alloy. Stack 108 may comprise any number of layers, greater than two. The number of layers may be even or odd. Further, the lower layer of stack 108 may be a germanium layer 114 or a layer 116 made of the first alloy.

Figure 2A:
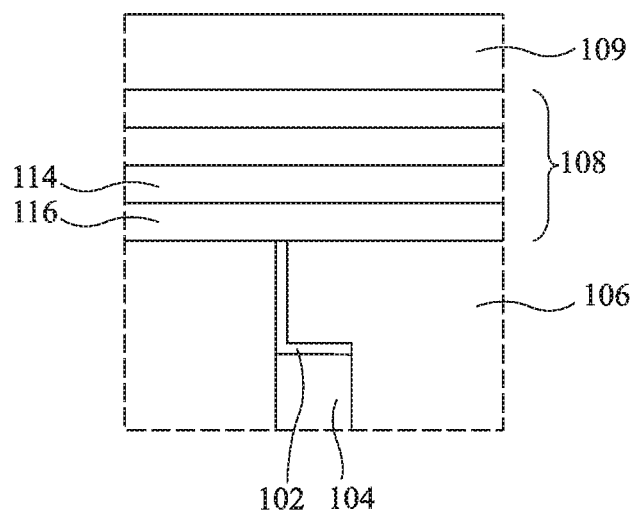
FIGS. 2A-2B show simplified cross-section views of two steps of manufacturing and potentially programming of the embodiment of FIG. 1.
Figure 2B:
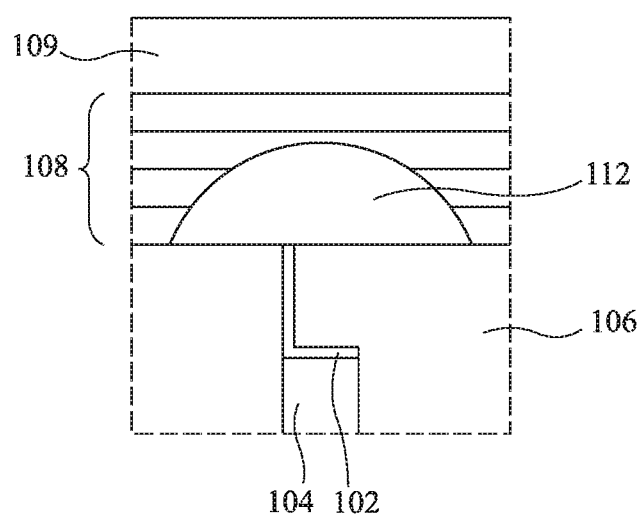

FIGS. 2A-2B show simplified cross-section views of two steps, respectively, illustrating the manufacturing and potentially the programming of the embodiment of FIG. 1.

Step a) shown in FIG. 2A comprises the manufacturing steps executed in order to obtain the embodiment of FIG. 1.

Step a) comprises:—forming the selection element, not shown;—forming insulating layer 106;—forming conductive via 104;—forming resistive element 102;—forming stack 108 on the upper surface of insulating layer 106 and on the upper surface of the vertical portion of resistive element 102. More specifically, layers 116 made of the first alloy and germanium layers 114 are alternately formed over the entire surface corresponding to the memory cell. In the embodiment of FIG. 1, the first layer, in contact with resistive element 102, is a layer 116 made of the first alloy; and—forming conductive layer 109, covering the upper layer of stack 108.

As a variation, the layers of stack 108 may be by a different number and have a different layout, as described in relation with FIG. 1. However, stack 108 comprises at least one germanium layer 114 and one layer 116 made of the first alloy.

Step b) shown in FIG. 2B, following step a), can be considered either a manufacturing step or a programming step. Step b) comprises an electrical operation called "Forming". During this operation, a high current pulse, typically higher than the pulses normally applied for programming memory cells, flows between conductive via 104 and conductive layer 109 and goes through resistive element 102 and stack 108.

The resistive element 102 heats until a temperature, for example higher than 600° C., preferably higher than 900° C., able to melt a portion of the materials of layers 114 and 116. This operation forms a portion 112 in a homogenous Ge-Rich alloy from the melted portions of layers 114 and 116. Portion 112 is the active zone of the phase change memory. Preferably, the "Forming" operation is designed in such a way that portion 112 is in the crystalline phase at the end of the operation.

Second portion 112 rests on the upper surface of layer 106 and the upper surface of the vertical portion of resistive element 102. Second portion 112 is thus in contact with resistive element 102. Second portion 112 substantially has a cross-section in the shape of a half circle, or a circle portion, centered on the contact area between the second portion and resistive element 102.

Portion 112 is made of a second alloy made of up germanium, antimony, and tellurium, the germanium concentration of the second alloy being greater than that of the first alloy. The second alloy is, like the first alloy, a phase-change material, such as what has been previously described. The proportions of the components of the second alloy are for example not stoichiometric. The proportion of germanium in the second alloy is for example between 1.5 times and 3.5 times the proportion of germanium in the first alloy.

The quantity of germanium in the second alloy depends on the quantity of germanium in the heated portions, that is, on the number and on the thickness of germanium layers 114, as compared with the quantity of the first alloy.

The data written, or programmed, into the memory cell are determined by the amorphous or crystalline phase of at least part of second portion 112.

The inventors have determined that the second alloy has a higher crystallization temperature of the amorphous phase than the first alloy. More specifically, the more germanium the second alloy comprises, the more the crystallization temperature increases.

The maximum welding temperatures (of the device of the integrated circuit chip) in its environment (generally on a printed circuit board) are approximately 150° C. and the maximum temperatures reached during the die soldering are approximately 260° C. Thus, memory cells having a crystallization temperature greater than 160° C. and the capacity to withstand temperatures greater than 200° C. for a few minutes, do not risk seeing their phase modified by the welding temperature. It is thus now possible to assemble programmed phase-change memory devices by welding, without losing the programmed data.

Another possibility would have been to directly deposit, during the manufacturing process, a layer of the second alloy instead of the stack 108. However, as the second alloy does not correspond to any stable phase of the Ge—Sb—Te ternary phase diagram, it would tend to segregate into separate stable phases during the following steps of the manufacturing process. Indeed, during the manufacturing process, the second alloy would be exposed to thermal treatments, at relatively high temperatures, for example equal and above 380° C. Those temperatures would cause the crystallization and segregation of the second alloy. Consequently, although the second alloy is an amorphous and homogenous layer as deposited, at the end the end of the manufacturing process and before the "Forming" operation, it would be made of randomly distributed regions of separate stable phases. It would for example be regions of Ge and $Ge_2Sb_2Te_5$, whose average sizes would depend on the thermal budget of the manufacturing process after the deposition of the layer made of the second alloy.

The "Forming" operation, as described in relation with FIG. 2B, would, afterward, create an active zone similar to the portion 112 shown in FIG. 2B. However, due to the random distribution, in location and size, of the regions, the local composition of the second alloy in the active zone would vary from cell to cell. This cell-to-cell variability of the alloy in the composition of the active zone would have a detectable impact on the distribution of cell parameters in the memory array. This impact would be all the more important that the cells have small critical dimensions.

An advantage of the embodiments described in relation with FIGS. 1 and 2A-2B is that they do not face the segregation of the layer made of the second alloy, as the materials of the layers already have stoechiometric proportions. Consequently, all memory cells fabricated by the same method with the same number of layers having the same thicknesses, and exposed, simultaneously or separately, to the same current pulse during the "Forming" operation are substantially identical. Such memory cells thus have a substantially identical operation. This remains true when the dimensions of the memory cells decrease.

Figure 3A:
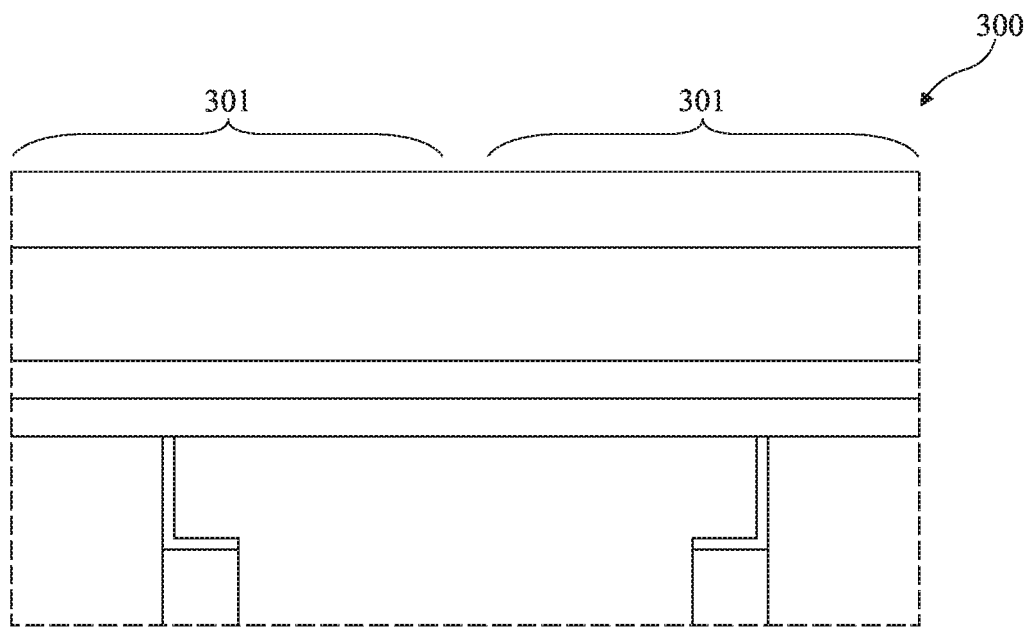
FIGS. 3A-3B schematically show cross-section views of an embodiment of a memory device before and after programming, respectively.
Figure 3B:
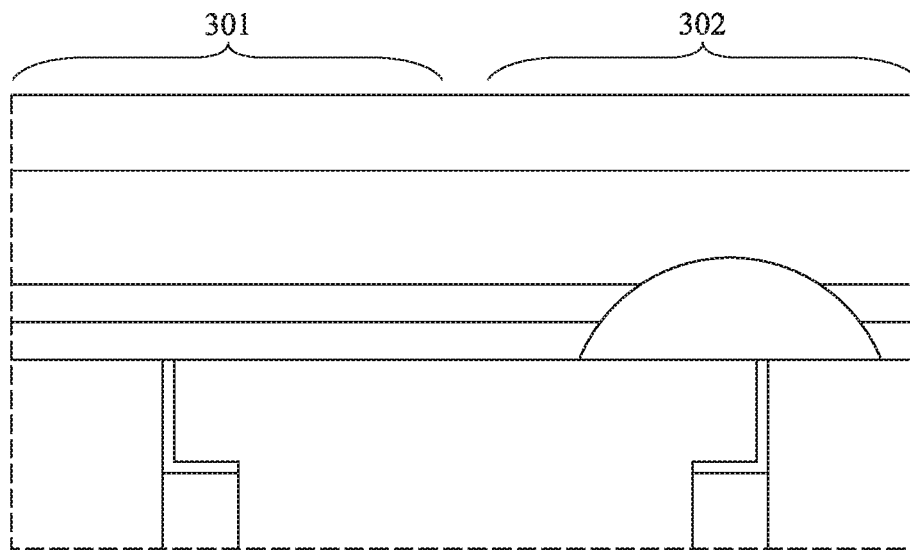

FIGS. 3A-3B schematically and partially show cross-section views of an embodiment of a memory device 300 before and after programming, respectively.

Before programming (structure shown in FIG. 3A), memory device 300 only comprises cells 301 similar to the memory cells described in relation with FIG. 1.

After the programming of the memory cells (structure shown in FIG. 3B), memory device 300 comprises cells 301 and cells 302 corresponding to the structures obtained after the programming method described in relation with FIG. 2B. Memory device 300 may comprise any number of memory cells 302 and any number of memory cells 301, independently from the number of memory cells 302. In the example of FIGS. 3A-3B, only one memory cell 302 and one memory cell 301 are shown after programming.

Cells 301 and 302 respectively correspond to a first and to a second logic state. For example, cells 301 correspond to state "0" and cells 302 correspond to state "1".

The programming of the memory cells comprises the "Forming" operation. The memory cells 301 where the second logic state is desired to be stored receive a current sufficiently high to cause the "Forming" operation described in relation with FIG. 2B and thus to form cells 302. Typically, an array of memory cells 301, some of which are heated to form cells 302, is used.

The temperature of the "Forming" operation being for example selected to be greater than the welding temperature used, the welding will cause no modification in the values programmed in the memory.

Figure 4:
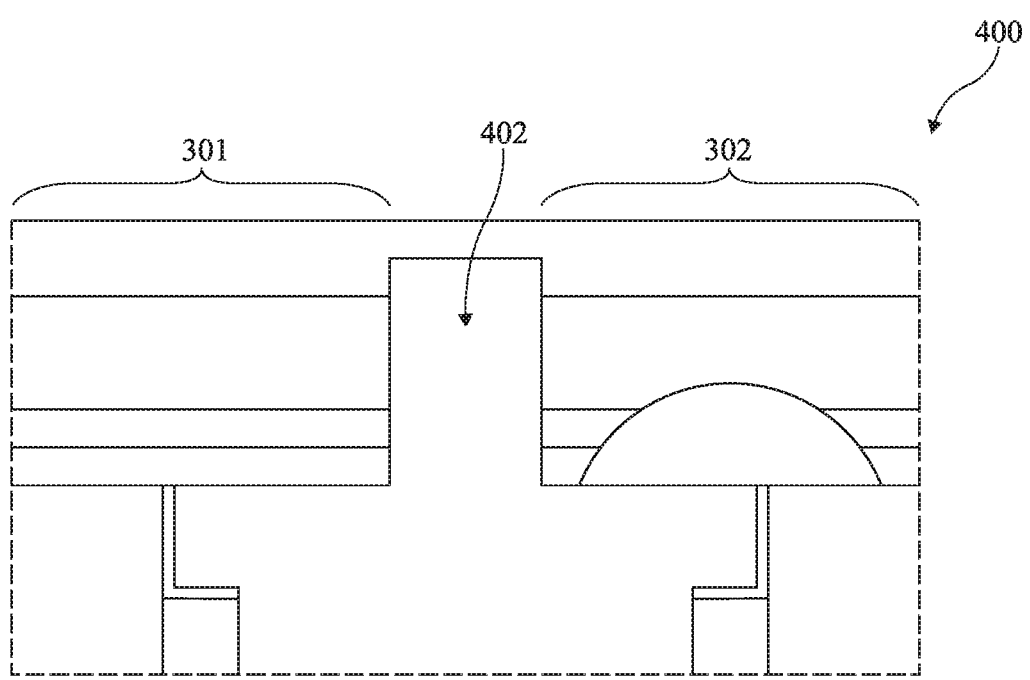
FIG. 4 schematically shows a cross-section view of another embodiment of a memory device.

FIG. 4 schematically shows a cross-section view of an embodiment of a memory device 400. Device 400 comprises the same elements as device 300, with the difference that device 400 comprises an insulating region 402 separating the stack 108 of adjacent cells from one another. Regions 402 enable to avoid for the state of a cell to interfere with the resistance measurement of the neighboring cells.

The previously-described memory devices 300 and 400 are one-time programmable (OTP) memory devices. Specifically, the "Forming" operation comprised in the programming of the embodiment of FIGS. 3A-3B and 4 is a one-time-only operation that modifies the structure of the memory cell 100 in an un-reversible way, locally destroying the layered structure. This one-time-only operation is used to pre-program, at wafer level before die assembly, a code in the whole phase change memory device or in part of it; this code will be retained after soldering. Furthermore, cells 302 are phase change memory cells and their phases can be switched between amorphous and crystalline to program a logic state. If needed, the cells 301 can go through the "Forming" operation after die assembly and soldering to become cells 302.

Several types of memory devices can be made using the embodiments described: a) a read-only memory device, in which the programming is done by the "Forming" operation during the manufacturing process; b) a one-time-only memory device, in which the programming, meaning the "Forming" operation, is done after a packaging operation, for example by the user; c) a phase change memory device, in which the cells can be reprogrammed by the user by changing the phase of the active zone; and d) a memory device comprising a combination of devices as described above, formed on a same chip by the same manufacturing process, differentiated by the electrical operations. For example, a chip comprising a phase change memory may also comprise read-only memory cells for memory array repairing data, code ROM for the memory controller, manufacturing codes, boot memory, etc.

In the case of a phase change memory device (c), some data may be preprogrammed in the memory using the "Forming" operation, as in the case of read-only memory devices and of one-time-only memory device. The data that require to be programmed at wafer level are typically the repairing data, the manufactoring codes, the code ROM of the controller of the phase change memory, any engineering data that must be stored in the device for history tracking purposes. Such preprogrammation would allow the data stored in the memory device to withstand the soldering process. The cells of the phase change memory device (c), the ones used by the user as an erasable programmable memory, would all go through the "Forming" operation at wafer level, during the manufacturing process in order to become reprogrammable phase change memory cells. In summary, the cells that need to be preprogrammed to a logic "0" do not go through the "Forming" operation at wafer level.

In embodiments which are described, the crystallization temperature of the second alloy does not need to be as high as it would if the data was preprogrammed without using the "Forming" operation. Consequently, the second alloy may avantageously comprise less germanium than it would if the data was preprogrammed without using the "Forming" operation. Indeed, it has been discovered that increasing the proportion of germanium in an alloy of germanium, antimony and tellurium increases the crystallization temperature but also increases a "Set Drift" phenomenon.

The "Set Drift" phenomenon is the increase of the resistance of an alloy in a crystalline phase (set state), caused by high temperatures. The "set drift" phenomenon is negligible in alloys of germanium, of antimony and of tellurium having stoichiometric proportions, but has a significant impact in alloys rich in germanium, like the second alloy. The "Set Drift" phenomenon is detrimental in a phase change memory because it reduces the difference between the resistances of the two phases and can cause mistakes in the reading of the memory. A similar phenomenon exists for the amorphous phase (reset state), however the increase of the amorphous phase resistance is not detrimental because it widens the resistance difference between the two states of the cell.

Thus it is advantageous to be able to withstand die soldering while avoiding the "Set Drift" phenomenon.

Figure 5:
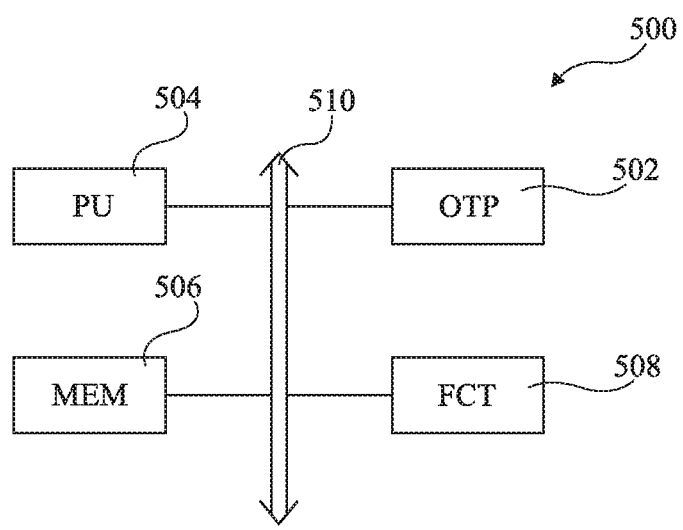
FIG. 5 schematically shows an embodiment of a read-once memory.

FIG. 5 schematically shows an embodiment of a memory 500.

Memory 500 comprises: one or a plurality of memory devices, such as devices a), b), c) or d) previously described, and shown in FIG. 5 by a block 502 (OTP). Block 502 also includes a circuit for addressing the array of memory cells; a data processing unit, represented by a block 504 (PU), for example, a microprocessor; one or a plurality of memory devices, represented by a block 506 (MEM), and which may be memory devices different from those of block 502. For example, it is possible for the memory devices of block 506 not to be phase-change memory devices but to be RAMs, reprogrammable volatile memories (EEPROM, flash, etc.), or to be phase-change memory devices which cannot be welded. The memory devices of block 506 are for example added to memory 500 after the welding steps; a block 508 (FCT) comprising other electronic functions, for example, sensors, load control circuits, etc.; and a data bus 510 enabling to transfer data between the different components.

As a variation, block 506 may be omitted. The memory devices of the memory are then only memory devices such as memory devices 300 and 400. The memory is then entirely a read-only memory.

Various embodiments and variations have been described. It will readily occur to those skilled in the art that certain characteristics of these various embodiments and variations may be combined, and other various will occur to those skilled in the art. In particular, although the method described in relation with FIG. 2 only concerns the forming of a memory cell, it should be understood that it is adapted to the simultaneous forming of a larger number of memory cells.

Finally, the practical implementation of the described embodiments and variations is within the abilities of those skilled in the art based on the functional indications given hereabove.

The invention claimed is:

1. A memory device, comprising:
an insulating layer including a first resistive heating element associated with a first phase-change memory cell and a second resistive heating element associated with a second phase-change memory cell;
a stack of layers which extends over the first and second resistive heating elements, the stack including:
a first layer made of a first alloy of germanium, antimony, and tellurium;
a germanium layer over the first layer made of the first alloy; and
a second layer made of the first alloy over the germanium layer; and
wherein the stack includes a region in contact with the second resistive heating element that is made of a second alloy of germanium, antimony, and tellurium, wherein the second alloy has a higher germanium concentration than the first alloy.

2. The memory device of claim 1, wherein the germanium layer has a thickness different from a thickness of each of the first and second layers.

3. The memory device of claim 1, wherein the germanium layer is doped with nitrogen.

4. The memory device of claim 1, wherein the first alloy is made of $Ge_2Sb_2Te_5$.

5. The memory device of claim 1, wherein the first layer and second layer have different proportions of germanium, antimony, and tellurium.

6. The memory device of claim 1, where the first resistive heating element and the second resistive heating element are in contact with the first layer of the stack.

7. The memory device of claim 1, wherein the first and second phase-change memory cells are adjacent memory cells separated by insulating regions.

8. The memory device of claim 1, wherein the memory device is a one-time programmable memory device.

9. The memory device of claim 1, wherein the first phase-change memory cell is programmed with a first logic state and the second phase-change memory cell is programmed with a second logic state.

10. The memory device of claim 1, wherein each of the first and second layers of the stack has a thickness greater than approximately 4 nm.

11. A memory device, comprising:
a first phase-change memory cell;
a second phase-change memory cell;
wherein the first and second phase-change memory a layer made of a first alloy of germanium, antimony, and tellurium and a layer made of germanium covering the layer made of the first alloy; and
wherein the second phase-change memory cell further comprises a region within the layer made of the first alloy and the layer made of germanium, wherein said region is made of a second alloy of germanium, antimony, and tellurium.

12. The device of claim 11, wherein the second alloy has a higher germanium concentration than the first alloy.

13. The device of claim 11, wherein the first and second phase-change memory cells are adjacent memory cells separated by insulating regions.

14. The device of claim 11, wherein the first alloy is $Ge_2Sb_2Te_5$.

15. The device of claim 11, wherein the device is a one-time programmable memory.

16. The device of claim 11, wherein the first phase-change memory cell is programmed at a first logic state and the second phase-change memory cell is programmed at a second logic state.

17. The device of claim 11, wherein the first phase-change memory cell comprises a resistive element in contact with the layer made of the first alloy, and wherein the second phase-change memory cell comprises a resistive element in contact with the region.

18. A memory device, comprising:
a first phase-change memory cell;
a second phase-change memory cell;
where the first phase-change memory cell comprises a stack of a layer made of germanium between two layers made of a first alloy of germanium, antimony, and tellurium; and
wherein the second phase-change memory cell comprises a layer made of the first alloy and a second alloy of germanium, antimony, and tellurium.

19. The device of claim 18, wherein each layer made of the first alloy in said stack has a thickness greater than approximately 4 nm.

20. The device of claim 18, wherein the first phase-change memory cell comprises a resistive element in contact with a lower layer of the first alloy in said stack, and wherein the second phase-change memory cell comprises a resistive element in contact with the second alloy of germanium, antimony, and tellurium.

21. The device of claim 18, wherein the layer made of germanium is doped with nitrogen.

22. The device of claim 18, wherein the second alloy has a higher germanium concentration than the first alloy.

23. The device of claim 18, wherein the first and second phase-change memory cells are adjacent memory cells separated by insulating regions.

24. The device of claim 18, wherein the first alloy is $Ge_2Sb_2Te_5$.

25. The device of claim 18, wherein the device is a one-time programmable memory.

26. The device of claim 18, wherein the first phase-change memory cell is programmed at a first logic state and the second phase-change memory cell is programmed at a second logic state.

27. A memory device, comprising:
 a first phase-change memory cell;
 a second phase-change memory cell;
 wherein the first phase-change memory cell comprises a layer made of a first alloy of germanium, antimony, and tellurium and a layer made of germanium covering the layer made of the first alloy; and
 wherein the second phase-change memory cell comprises a first portion comprising a stack of a layer of germanium between two layers of the first alloy and a second portion made of a second alloy of germanium, antimony, and tellurium.

28. The device of claim 27, wherein the first phase-change memory cell comprises a resistive element in contact with the layer made of the first alloy, and wherein the second phase-change memory cell comprises a resistive element in contact with the second portion made of the second alloy.

29. The device of claim 27, wherein the second alloy has a higher germanium concentration than the first alloy.

30. The device of claim 27, wherein the first and second phase-change memory cells are adjacent memory cells separated by insulating regions.

31. The device of claim 27, wherein the first alloy is $Ge_2Sb_2Te_5$.

32. The device of claim 27, wherein the device is a one-time programmable memory.

33. The device of claim 27, wherein the first phase-change memory cell is programmed at a first logic state and the second phase-change memory cell is programmed at a second logic state.

34. A memory device, comprising:
 first and second phase-change memory cells comprising a stack of at least one layer made of germanium covering a layer made of a first alloy made up of germanium, of antimony, and of tellurium; and
 wherein the second memory cells further comprise a second alloy made up of germanium, of antimony, and of tellurium within said stack;
 wherein the first and second alloys are different.

35. The device of claim 34, wherein the second alloy has a higher germanium concentration than the first alloy.

36. The device of claim 34, wherein the stack comprises said at least one germanium layer between two layers of the first alloy.

37. The device of claim 36, wherein the at least one germanium layer has a thickness greater than approximately 4 nm.

38. The device of claim 36, wherein each first phase-change memory cell comprises a resistive element in contact with a lower layer of the stack, and wherein each second phase-change memory cell comprises a resistive element in contact with the second alloy.

39. The device of claim 36, wherein the at least one layer of germanium is doped with nitrogen.

40. The device of claim 34, wherein the stack comprises said at least one germanium layer between two layers of the first alloy and wherein said second alloy extends completely through a lower layer of the first alloy and further extends completely through said at least one germanium layer into an upper layer of the first alloy.

41. The device of claim 34, wherein each first phase-change memory cell comprises a resistive element in contact with the layer made of the first alloy, and wherein each second phase-change memory cell comprises a resistive element in contact with the second alloy within the stack.

42. The device of claim 34, wherein the first and second phase-change memory cells are separated by insulating regions.

43. The device of claim 34, wherein the first alloy is $Ge_2Sb_2Te_5$.

44. A one-time programmable memory comprising at least one memory device as in claim 34.

45. The memory of claim 44, wherein first phase-change memory cells in the memory correspond to a first logic state and the second phase-change memory cells correspond to a second logic state.

* * * * *